(12) United States Patent
Laturell et al.

(10) Patent No.: US 8,995,521 B2
(45) Date of Patent: Mar. 31, 2015

(54) METHOD AND APPARATUS FOR HIGH DENSITY PULSE DENSITY MODULATION

(71) Applicant: LSI Corporation

(72) Inventors: Donald R. Laturell, Oak Hill, FL (US); Said E. Abdelli, Minneapolis, MN (US); Peter Kiss, Basking Ridge, NJ (US); James F. MacDonald, Stillwater, MN (US); Ross S. Wilson, Menlo Park, CA (US); Kameran Azadet, Pasadena, CA (US)

(73) Assignee: LSI Corporation, San Jose, CA (US)

( * ) Notice: Subject to any disclaimer, the term of this patent is extended or adjusted under 35 U.S.C. 154(b) by 206 days.

(21) Appl. No.: 13/663,534

(22) Filed: Oct. 30, 2012

(65) Prior Publication Data
US 2014/0119427 A1    May 1, 2014

(51) Int. Cl.
*H03K 7/04*    (2006.01)
*H04L 27/04*   (2006.01)
*H03M 5/04*    (2006.01)
*H03G 11/00*   (2006.01)

(52) U.S. Cl.
CPC .............. *H04L 27/04* (2013.01); *H03M 5/04* (2013.01); *H03G 11/002* (2013.01)
USPC .......................................... 375/239; 375/297

(58) Field of Classification Search
CPC ....... H03F 1/0288; H03F 1/3276; H03F 3/20; H03F 3/217; H03F 3/24; H03G 11/002; H03M 5/04; H04L 27/04
USPC ............... 375/239, 296–297; 330/124 R, 295
See application file for complete search history.

(56) References Cited

U.S. PATENT DOCUMENTS

| | | | |
|---|---|---|---|
| 6,014,059 A * | 1/2000 | Nordwall | 330/289 |
| 7,460,500 B2 | 12/2008 | Itahara et al. | |
| 2007/0164818 A1* | 7/2007 | Horiguchi et al. | 330/124 R |
| 2008/0180166 A1* | 7/2008 | Gustat | 330/10 |
| 2012/0069930 A1* | 3/2012 | Vromans et al. | 375/295 |

* cited by examiner

*Primary Examiner* — David B. Lugo
(74) *Attorney, Agent, or Firm* — Suiter Swantz pc llo

(57) ABSTRACT

A method and system for high density pulse density modulation is disclosed. In accordance with the present disclosure, a modulation function is split in to two band limited streams using a complementary pair of non-linear functions. More specifically, one bitstream definition contains the peaks of the original function while the other bitstream contains a soft clipping version of the original bitstream. The bitstreams are applied to a pair of switching amplifiers, and the bitstreams can be combined again to reconstruct the original function. The method in accordance with the present disclosure limits the amount of input power necessary to achieve higher output power, lowers operating voltage and improves power amplifier efficiency.

20 Claims, 2 Drawing Sheets

METHOD AND APPARATUS FOR HIGH DENSITY PULSE DENSITY MODULATION

TECHNICAL FIELD

The present invention relates to the field of signal processing and particularly to a method and apparatus for high density pulse density modulation.

BACKGROUND

Pulse density modulation is a form of modulation used to represent an analog signal with digital data. A pulse density modulation signal utilizes the relative density of the pulses to represent the amplitude of the analog signal. There are various methods for encoding an analog signal into a digital signal. For instance, encoding methods such as delta-sigma modulation takes a multi-bit signal and convert it to ones and zeros generally referred to as a bitstream. However, such encoding methods tend to be unstable at high densities, and therefore many encoding methods set limits on the pulse densities that can be processed in order to satisfy the stability requirements. Therein lies the need to provide a method and apparatus for high density pulse density modulation without the aforementioned shortcomings.

SUMMARY

Accordingly, an embodiment of the present disclosure is directed to a method for high density pulse density modulation. The method includes: receiving a bitstream; splitting the bitstream in to two complementary streams, wherein one of the two complementary streams contains a soft clipped stream of the received bitstream, and another one of the two complementary streams contains extracted peaks of the received bitstream; and amplifying each of the two complementary streams independently for transmission.

A further embodiment of the present disclosure is directed to a system for high density pulse density modulation. The system includes: a bitstream generator configured for generating a bitstream; a split mechanism communicatively coupled with the bitstream generator, the split mechanism configured for splitting the bitstream in to two complementary streams, wherein one of the two complementary streams contains a soft clipped stream of the received bitstream, and another one of the two complementary streams contains extracted peaks of the received bitstream; a first power amplifier configured for amplifying one of the two complementary streams; and a second power amplifier configured for amplifying the other one of the two complementary streams, wherein the first and second power amplifiers operates independently with respect to each other.

An additional embodiment of the present disclosure is directed to a bitstream splitting apparatus. The bitstream splitting apparatus includes a processor and a computer-readable device having computer-executable instructions for splitting a bitstream in to two complementary streams. One of the two complementary streams contains a soft clipped stream of the bitstream, and another one of the two complementary streams contains extracted peaks of the bitstream.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION

Reference will now be made in detail to the presently preferred embodiments of the invention, examples of which are illustrated in the accompanying drawings.

The present disclosure is directed to a method for high density pulse density modulation. In accordance with the present disclosure, a modulation function is split in to two band limited streams using a complementary pair of non-linear functions. More specifically, one bitstream definition contains the peaks of the original function while the other bitstream contains a soft clipping version of the original bitstream. The bitstreams are applied to a pair of switching amplifiers, and the bitstreams can be combined again to reconstruct the original function. The method in accordance with the present disclosure limits the amount of input power necessary to achieve higher output power, which equates to lower operating voltage and higher power amplifier efficiency.

Figure 1:
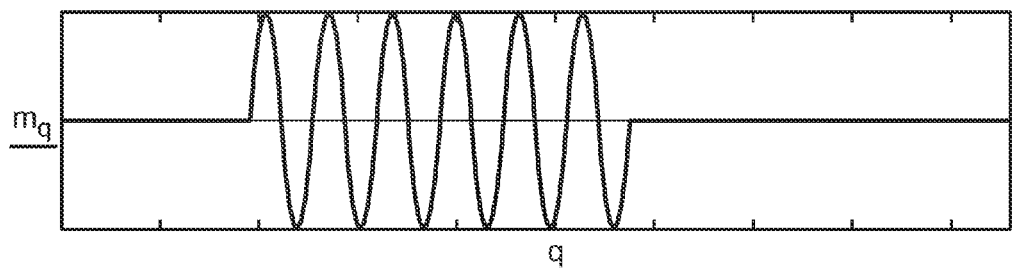
FIG. 1 is an illustration depicting a sinusoid corresponding to a sine function.
Figure 2:
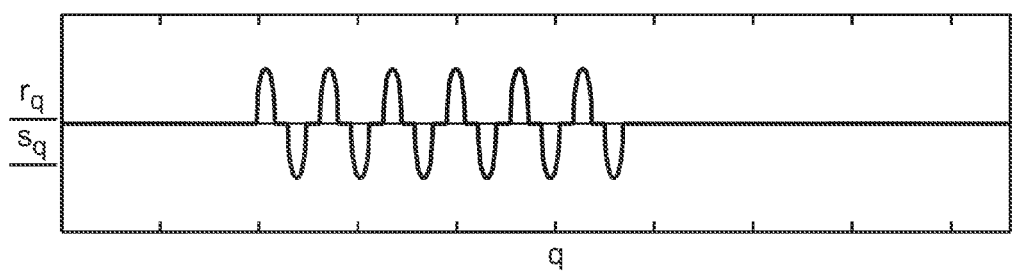
FIGS. 2 and 3 are illustrations depicting the sine function of FIG. 1 being split in to two complementary pair of streams.
Figure 3:
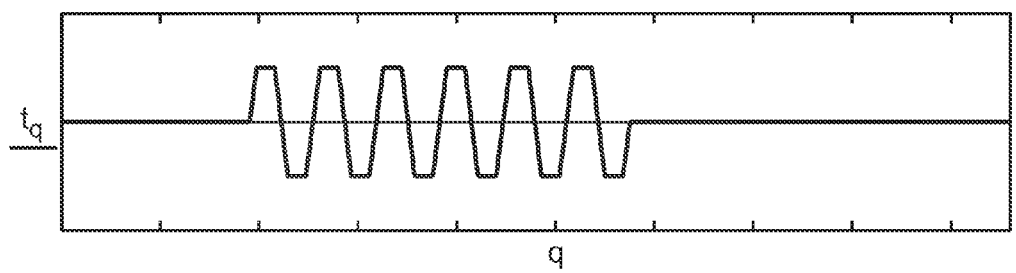

FIGS. 1 through 3 are illustrations depicting the splitting technique in accordance with one embodiment of the present disclosure. FIG. 1 depicts a sinusoid corresponding to a simple sine function $$m_q = \sin\left(q \cdot 2 \cdot \pi \cdot \frac{F_1}{F_s}\right),$$

which is a sampled function with a sample rate of $$\frac{F_1}{F_s}$$

where $F_s \geq 2F_1$. It is understood that this simple sine function is used for illustrative purposes. The actual functions utilized in practice may vary and may be much more complex than the sine function depicted above without departing from the spirit and scope of the present disclosure.

Applying the splitting technique in accordance with the present disclosure, function $$m_q = \sin\left(q \cdot 2 \cdot \pi \cdot \frac{F_1}{F_s}\right)$$

is split in to two band limited streams. One of the bitstreams contains the peaks of $m_q$ as shown in FIG. 2, which is extracted utilizing a pair of inequalities at high modulation levels. In this exemplary embodiment, a threshold value $v_i$ is utilized to indicate whether $m_q$ has reached high modulation levels. More specifically:

$$r_q = \begin{cases} m_q - v_i, & m_q > v_i \\ 0, & m_q \leq v_i \end{cases}$$

$$s_q = \begin{cases} m_q + v_i, & m_q < -v_i \\ 0, & m_q \geq -v_i \end{cases}$$

That is, $r_q$ and $s_q$ together represent the extracted peaks of $m_q$ when $m_q$ exceeds high modulation levels.

On the other hand, another bistream of the pair is a complementary bitstream that contains a soft clipping version of $m_q$. In the exemplary embodiment, the same threshold value $v_i$ is utilized to indicate whether soft clipping of $m_q$ should occur. More specifically:

$$l_q = \begin{cases} m_q, & m_q > -v_i \\ -v_i, & m_q \leq -v_i \end{cases}$$

$$t_q = \begin{cases} v_i, & l_q > v_i \\ l_q, & l_q \leq v_i \end{cases}$$

That is, $t_q$ as defined above is employed to limit the amplitude of the original function with the result shown in FIG. 3.

Figure 4:
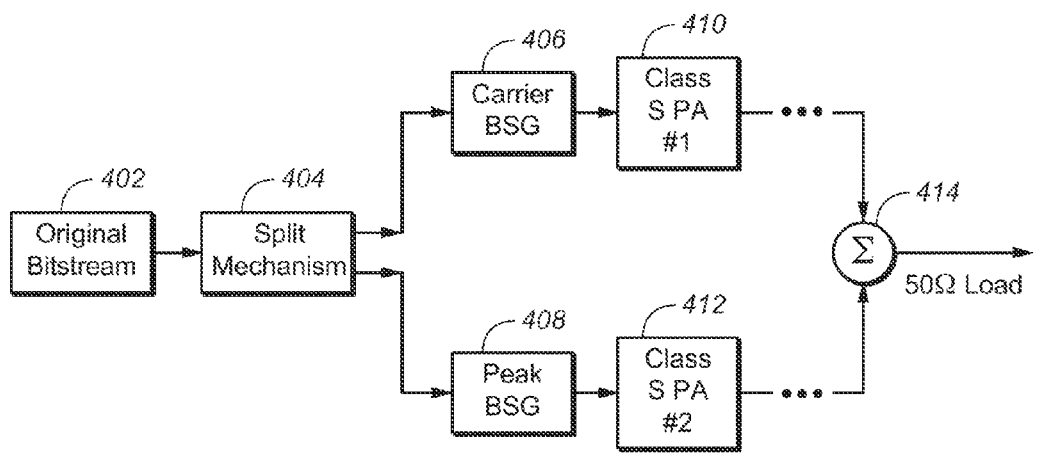
FIG. 4 is a block diagram depicting a system for high density pulse density modulation in accordance with the present disclosure.

Referring now to FIG. 4, a block diagram illustrating the transmission of the complementary pair of bitstreams is shown. Upon receiving a bitstream (may be referred to as the original bitstream in the description below) from a bitstream generator 402 or the like, the split mechanism 404 splits the received bitstream in to two complementary streams. The split mechanism 404 includes a processor and computer-executable instructions stored in a computer-readable device (e.g., a memory device). The processor of the split mechanism 404 is utilized to execute the instructions to split the received bitstream. Block 406 depicts the first bitstream that represents the soft clipping version of $m_q$ (i.e., $t_q$ in the description above) and block 408 depicts the second bitstream that represents the extracted peaks of $m_q$ when $m_q$ exceeds high modulation levels (i.e., $r_q$ and $s_q$ in the description above). The first bitstream and the second bitstream are received and amplified utilizing a first amplifier 410 and a second amplifier 412, respectively.

At low modulated power levels, i.e., when $m_q$ does not exceed the threshold $v_i$, the second bitstream is null by definition and therefore only the first amplifier 410 needs to be engaged. As modulated power level increases, to the point where $m_q$ exceeds the threshold $v_i$, the power in the first amplifier 410 is limited while the power in the second amplifier 412 begins to increase. Since the second amplifier 412 only operates at peak levels, the duty cycle is reduced and the device continuous power rating is also reduced. Furthermore, utilizing the complementary pair of bitstreams in this manner limits the amount of input power necessary to achieve higher output power, which equates to lower operating voltage and higher power amplifier efficiency.

Once the bitstreams go through their corresponding power amplifiers, the amplified signals are eventually received at a combining module 414, which combines the signals to reconstruct the original bitstream. In one embodiment, no change of impedance is expected for the bitstream related to the "peak function" (or more broadly referred to as the second bitstream as described above) when a signal is static. Since the two bitstreams are complementary with respect to each other, the reconstruction process is straightforward and introduced minimal signal distortion. In yet another embodiment, there may be a change of impedance in which case the combining module 414 that performs the summing function may be more than just a simple combiner. Furthermore, well known digital pre-distortion techniques may be employed to further restore the original function and minimize distortions if any.

It is contemplated that while the threshold value $v_i$ is presented as a static value in the embodiment described above, it is merely utilized for illustrative purposes. Instead of establishing a static threshold value $v_i$, the threshold $v_i$ may be dynamically adjusted based on various operating conditions such as the operating frequency, carrier frequency or the like. The splitting technique implemented in this manner essentially functions a double-ended limit comparator to split the original signal stream in to two band limited complementary streams, which can be used to reconstruct the original signal stream.

It is also contemplated that the splitting technique is not limited to function only as a double-ended limit comparator. In an alternative embodiment, the replacement value for $l_q$ is defined as a function of $v_i$, i.e., $f(v_i)$. More specifically:

$$l_q = \begin{cases} m_q, & m_q > -v_i \\ f(v_i), & m_q \leq -v_i \end{cases}$$

$$t_q = \begin{cases} f(v_i), & l_q > v_i \\ l_q, & l_q \leq v_i \end{cases}$$

It is contemplated that $f(v_i)$ can be a compression function of $v_i$. In such an embodiment, instead of having flat limits at peak regions as shown in FIG. 3, peak regions still form the intended shapes but in a compressed manner. It is also contemplated that $f(V_i)$ can be a band limited version of $v_i$, or any other function that allows the complementary bitstream to carry information for reconstructing (decompressing) these replaced regions, therefore still able to reconstruct the original signal stream without departing from the spirit and scope of the present disclosure.

Figure 5:
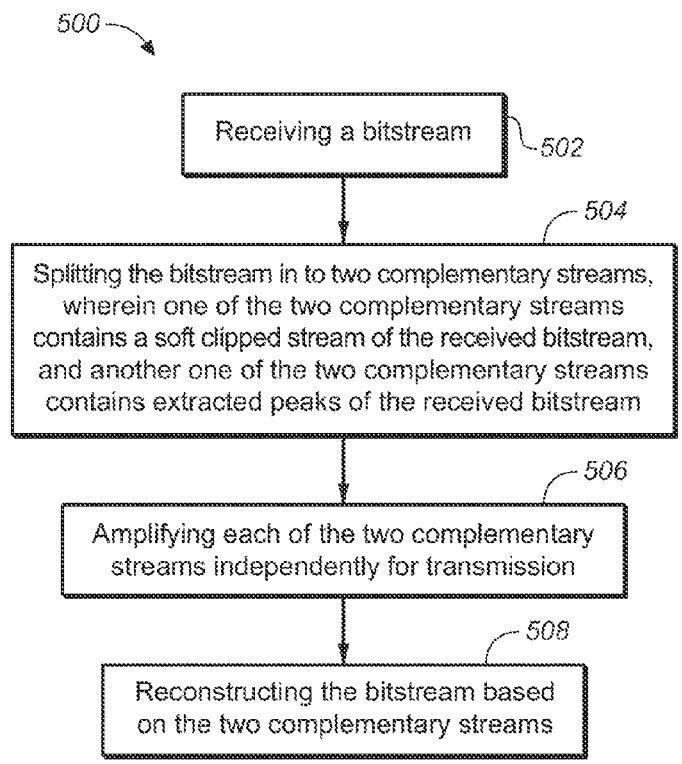
FIG. 5 is a flow diagram depicting a method for high density pulse density modulation in accordance with the present disclosure.

Referring now to FIG. 5, a flow diagram depicting a method for high density pulse density modulation in accordance with the present disclosure is shown. Upon receiving a bitstream in step 502, step 504 splits the received bitstream in to two complementary streams. As described above, one of the two streams contains a soft clipped stream of the received bitstream, and the other stream contains extracted peaks of the received bitstream. Step 506 then amplifies each of the two complementary streams independently for transmission. Furthermore, as previously described, the amplified signals will eventually be received at a combining module, which reconstructs the original bitstream based on the two complementary streams as indicated in step 508.

It is understood that while the method and system described above split the received bitstream in to two streams, it is possible or desirable in certain applications to utilize more than two streams. It is contemplated that the specific split functions may be configured to split the bitstream in to different numbers of streams without departing from the spirit and scope of the present disclosure.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for high density pulse density modulation, comprising:
   receiving a bitstream;
   splitting the bitstream in to two complementary streams based on whether a modulation level exceeds a limiting value v, wherein a first one of the two complementary streams contains a soft clipped stream of the received bitstream limited by the limiting value v, and a second one of the two complementary streams contains only extracted portions of the received bitstream, wherein when a portion of the received bitstream is greater than v, said portion of the received bitstream is represented based on a difference of said portion of the received bitstream and the limiting value v in the second one of the two complementary streams, and wherein when a portion of the received bitstream is less than −v, said portion of the received bitstream is represented based on a sum of said portion of the received bitstream and the limiting value v in the second one of the two complementary streams; and
   amplifying each of the two complementary streams independently for transmission.

2. The method of claim 1, wherein the soft clipped stream contained in the first one of the two complementary streams is compressed.

3. The method of claim 1, wherein the limiting value is a static value.

4. The method of claim 1, wherein the limiting value is dynamically adjustable.

5. The method of claim 1, wherein the limiting value is determined based on a function.

6. The method of claim 1, further comprising:
   amplifying each of the two complementary streams independently for transmission.

7. A system for high density pulse density modulation, comprising:
   a bitstream generator configured for generating a bitstream;
   a split mechanism communicatively coupled with the bitstream generator, the split mechanism configured for splitting the bitstream in to two complementary streams based on whether a modulation level exceeds a limiting value v, wherein a first one of the two complementary streams contains a soft clipped stream of the received bitstream limited by the limiting value v, and a second one of the two complementary streams contains only extracted portions of the received bitstream, wherein when a portion of the received bitstream is greater than v, said portion of the received bitstream is represented based on a difference of said portion of the received bitstream and the limiting value v in the second one of the two complementary streams, and wherein when a portion of the received bitstream is less than −v, said portion of the received bitstream is represented based on a sum of said portion of the received bitstream and the limiting value v in the second one of the two complementary streams;
   a first power amplifier configured for amplifying the first one of the two complementary streams; and
   a second power amplifier configured for amplifying the second one of the two complementary streams.

8. The system of claim 7, wherein the split mechanism is configured to compress the soft clipped stream in the first one of the two complementary streams.

9. The system of claim 7, wherein the limiting value is a static value.

10. The system of claim 7, wherein the limiting value is dynamically adjustable.

11. The system of claim 7, wherein the limiting value is determined based on a function.

12. The system of claim 7, wherein the first and second power amplifiers operate independently with respect to each other.

13. The system of claim 7, wherein the first and second power amplifiers are switch-mode power amplifiers.

14. The system of claim 13, wherein the first and second power amplifiers are Class-S power amplifiers.

15. A bitstream splitting apparatus, comprising:
   a processor; and
   a computer-readable device having computer-executable instructions for splitting a bitstream in to two complementary streams based on whether a modulation level exceeds a limiting value v, wherein a first one of the two complementary streams contains a soft clipped stream of the bitstream limited by the limiting value v, and a second one of the two complementary streams contains only extracted portions of the bitstream, wherein when a portion of the received bitstream is greater than v, said portion of the received bitstream is represented based on a difference of said portion of the received bitstream and the limiting value v in the second one of the two complementary streams, and wherein when a portion of the received bitstream is less than −v, said portion of the received bitstream is represented based on a sum of said portion of the received bitstream and the limiting value v in the second one of the two complementary streams.

16. The bitstream splitting apparatus of claim 15, wherein the soft clipped stream contained in the first one of the two complementary streams is compressed.

17. The bitstream splitting apparatus of claim 15, wherein the limiting value is a static value.

18. The bitstream splitting apparatus of claim 15, wherein the limiting value is dynamically adjustable.

19. The bitstream splitting apparatus of claim 15, wherein the limiting value is determined based on a function.

20. The bitstream splitting apparatus of claim 15, wherein the computer-readable device further includes computer-executable instructions for providing each of the two complementary streams to an independently operating power amplifier.

* * * * *